(12) United States Patent
Balan

(10) Patent No.: US 7,992,877 B2
(45) Date of Patent: Aug. 9, 2011

(54) NON CONTACT SUBSTRATE CHUCK

(75) Inventor: Aviv Balan, Mountain View, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 981 days.

(21) Appl. No.: 11/865,203

(22) Filed: Oct. 1, 2007

(65) Prior Publication Data

US 2009/0067114 A1  Mar. 12, 2009

Related U.S. Application Data

(60) Provisional application No. 60/970,300, filed on Sep. 6, 2007.

(51) Int. Cl.
*B23B 31/30* (2006.01)

(52) U.S. Cl. ............... 279/3; 269/21; 451/289

(58) Field of Classification Search ........ 279/3; 269/21; 451/289; 118/500
See application file for complete search history.

(56) References Cited

U.S. PATENT DOCUMENTS

| | | | |
|---|---|---|---|
| 5,180,000 A * | 1/1993 | Wagner et al. ................. 165/80.1 |
| 5,830,277 A * | 11/1998 | Johnsgard et al. ............. 118/725 |
| 6,241,825 B1 * | 6/2001 | Wytman ........................ 118/733 |
| 6,375,176 B1 * | 4/2002 | Getchel et al. ................... 269/21 |
| 6,672,576 B1 * | 1/2004 | Walker ............................ 269/21 |
| 7,091,443 B2 * | 8/2006 | Watanabe et al. ........ 219/121.52 |
| 7,189,313 B2 * | 3/2007 | Lubomirsky .................. 204/212 |
| 7,397,648 B2 * | 7/2008 | Otaka et al. ................... 361/234 |
| 7,517,431 B2 * | 4/2009 | Choi et al. ................ 156/345.55 |
| 7,603,028 B2 * | 10/2009 | Yassour et al. ................. 392/477 |
| 7,643,130 B2 * | 1/2010 | Yoshitake et al. ............... 355/75 |
| 7,665,717 B2 * | 2/2010 | Lenzini ............................ 269/21 |
| 7,728,256 B2 * | 6/2010 | Jung et al. ................. 219/121.82 |
| 2002/0000198 A1 * | 1/2002 | Ishikawa et al. ............... 118/715 |
| 2005/0000949 A1 * | 1/2005 | Watanabe et al. ........ 219/121.52 |
| 2006/0112880 A1 * | 6/2006 | Iwabuchi et al. .............. 118/724 |
| 2008/0145190 A1 * | 6/2008 | Yassour et al. ................. 414/147 |

FOREIGN PATENT DOCUMENTS

| | | |
|---|---|---|
| KR | 10-2004-0073087 | 8/2004 |
| WO | 2005086588 | 9/2005 |
| WO | WO 2005086588 A2 * | 9/2005 |

* cited by examiner

*Primary Examiner* — Eric A Gates
*Assistant Examiner* — Bayan Salone
(74) *Attorney, Agent, or Firm* — Luedeka, Neely & Graham, P.C.

(57) ABSTRACT

A chuck for releasably retaining a substrate, where the chuck has a body with a substrate receiving surface disposed in an X-Y coordinate plane and adapted to receive the substrate. The body has gas pressure delivery channels and gas vacuum drawing channels, where the gas pressure delivery channels and gas vacuum drawing channels are mutually exclusive within the body. The substrate receiving surface has gas pressure delivery portions in communication with the gas pressure delivery channels, for delivering a gas pressure against the substrate while the substrate is retained by the chuck, and thereby keeping the substrate from contacting the substrate receiving surface. The substrate receiving surface also has gas vacuum drawing portions in communication with the gas vacuum drawing channels, for drawing a gas vacuum against the substrate while the substrate is retained by the chuck, and thereby retaining the substrate proximate the substrate receiving surface. Retaining means retain the substrate in X-Y directions from sliding off of the substrate receiving surface.

6 Claims, 2 Drawing Sheets

NON CONTACT SUBSTRATE CHUCK

This application claims all priorities and other benefits of prior pending U.S. provisional application 60/970,300, filed Sep. 6, 2007.

FIELD

This invention relates to the field of integrated circuit fabrication. More particularly, this invention relates to retaining a substrate in a chuck.

BACKGROUND

Integrated circuits are typically fabricated on a substrate, which is subsequently singulated to produce the individual integrated circuits. As the term is used herein, "integrated circuit" includes devices such as those formed on monolithic semiconducting substrates, such as those formed of group IV materials like silicon or germanium, or group III-V compounds like gallium arsenide, or mixtures of such materials. The term includes all types of devices formed, such as memory and logic, and all designs of such devices, such as MOS and bipolar. The term also comprehends applications such as flat panel displays, solar cells, and charge coupled devices.

Before singulation, the integrated circuits on the substrate are processed through a number of different steps. Many of these process steps, and many of the transfer operations between the process steps, use so-called wafer chucks to retain, move, and position the substrates. For example, a chuck is used to retain and spin the substrate during a photoresist coating operation. Chucks are also used to retain and heat or cool a substrate during a sputter deposition process.

Chucks operate by having some retaining means that holds the substrate, with the back of the substrate in physical contact with the face of the chuck. The retaining means take on different forms, such as clamps against the face of the substrate that retain the substrate against the face of the chuck, annular vacuum rings that draw the back of the substrate against the face of the chuck, and alternating electrostatic charges that hold the substrate against the face of the chuck. In each instance, however, the back of the substrate is in physical contact with the face of the chuck. This physical contact has the tendency to introduce physical damage in and contamination to the substrate.

What is needed, therefore, is a system that overcomes problems such as those described above, at least in part.

SUMMARY

The above and other needs are met by a chuck for releasably retaining a substrate, where the chuck has a body with a substrate receiving surface disposed in an X-Y coordinate plane and adapted to receive the substrate. The body has gas pressure delivery channels and gas vacuum drawing channels, where the gas pressure delivery channels and gas vacuum drawing channels are mutually exclusive within the body. The substrate receiving surface has gas pressure delivery portions in communication with the gas pressure delivery channels, for delivering a gas pressure against the substrate while the substrate is retained by the chuck, and thereby keeping the substrate from contacting the substrate receiving surface. The substrate receiving surface also has gas vacuum drawing portions in communication with the gas vacuum drawing channels, for drawing a gas vacuum against the substrate while the substrate is retained by the chuck, and thereby retaining the substrate proximate the substrate receiving surface. Retaining means retain the substrate in X-Y directions from sliding off of the substrate receiving surface.

In this manner, the gas vacuum drawing portions of the receiving surface keep the substrate retained proximate the chuck, while the gas pressure delivery portions of the substrate receiving surface keep the back of the substrate from making physical contact with the chuck. Thus, the substrate is held in a hovering position above the substrate receiving surface of the chuck, and the retaining means prevent the substrate from sliding off of the substrate receiving surface. In this manner, the substrate is reliably held by the chuck, but the back of the substrate is neither damaged nor contaminated by the substrate receiving surface of the chuck.

In various embodiments, the body is formed of a ceramic or carbon material. In some embodiments the gas pressure delivery portions include a porous material. In some embodiments the gas vacuum drawing portions include open channels formed in the substrate receiving surface of the body. In some embodiments the retaining means include two fixed pins and one adjustable pin disposed at substantially equidistant positions around a peripheral edge of the substrate receiving surface. In some embodiments the substrate receiving surface is substantially round. In some embodiments the body includes a gas pressure port for connection to a gas pressure source, with the gas pressure port in communication with the gas pressure delivery channels. In some embodiments the body includes a gas vacuum port for connection to a gas vacuum source, with the gas vacuum port in communication with the gas vacuum drawing channels.

According to another aspect of the invention there is described a chuck for releasably retaining a substrate, the chuck having a body formed of a substantially non-porous material. A substrate receiving surface formed of discreet annular rings of a porous material is disposed in an X-Y coordinate plane and receives the substrate. The substrate receiving surface is disposed on a top surface of the body. The body has gas pressure delivery channels and gas vacuum drawing channels, where the gas pressure delivery channels and gas vacuum drawing channels are mutually exclusive within the body. The substrate receiving surface has gas pressure delivery portions in communication with the gas pressure delivery channels, where the substrate receiving surface define gaps between the discreet annular rings, the gaps defining gas vacuum drawing portions that are in communication with the gas vacuum drawing channels. Retaining means retain the substrate in X-Y directions from sliding off of the substrate receiving surface.

According to yet another aspect of the invention there is described a chuck for releasably retaining a substrate, the chuck having a body formed of a porous material having a substantially complete vitreous shell. The body has a substrate receiving surface disposed on an X-Y coordinate plane in a top surface of the body, the substrate receiving surface adapted to receive the substrate. The body has gas vacuum drawing channels with vitreous sidewalls. The substrate receiving surface has gas pressure delivery portions, the gas pressure delivery portions having a porous surface and not a vitreous shell. The substrate receiving surface defines recessed gaps between the gas pressure delivery portions, where the recessed gaps define gas vacuum drawing portions that are in communication with the gas vacuum drawing channels. Retaining means retain the substrate in X-Y directions from sliding off of the substrate receiving surface.

In various embodiments according to this aspect of the invention, the chuck is formed of a ceramic or carbon material. In some embodiments a gas pressure port connects to a gas pressure source, the gas pressure port having a porous surface and not a vitreous shell. In some embodiments the gas pressure delivery portions form a pattern of annular rings in the substrate receiving surface.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
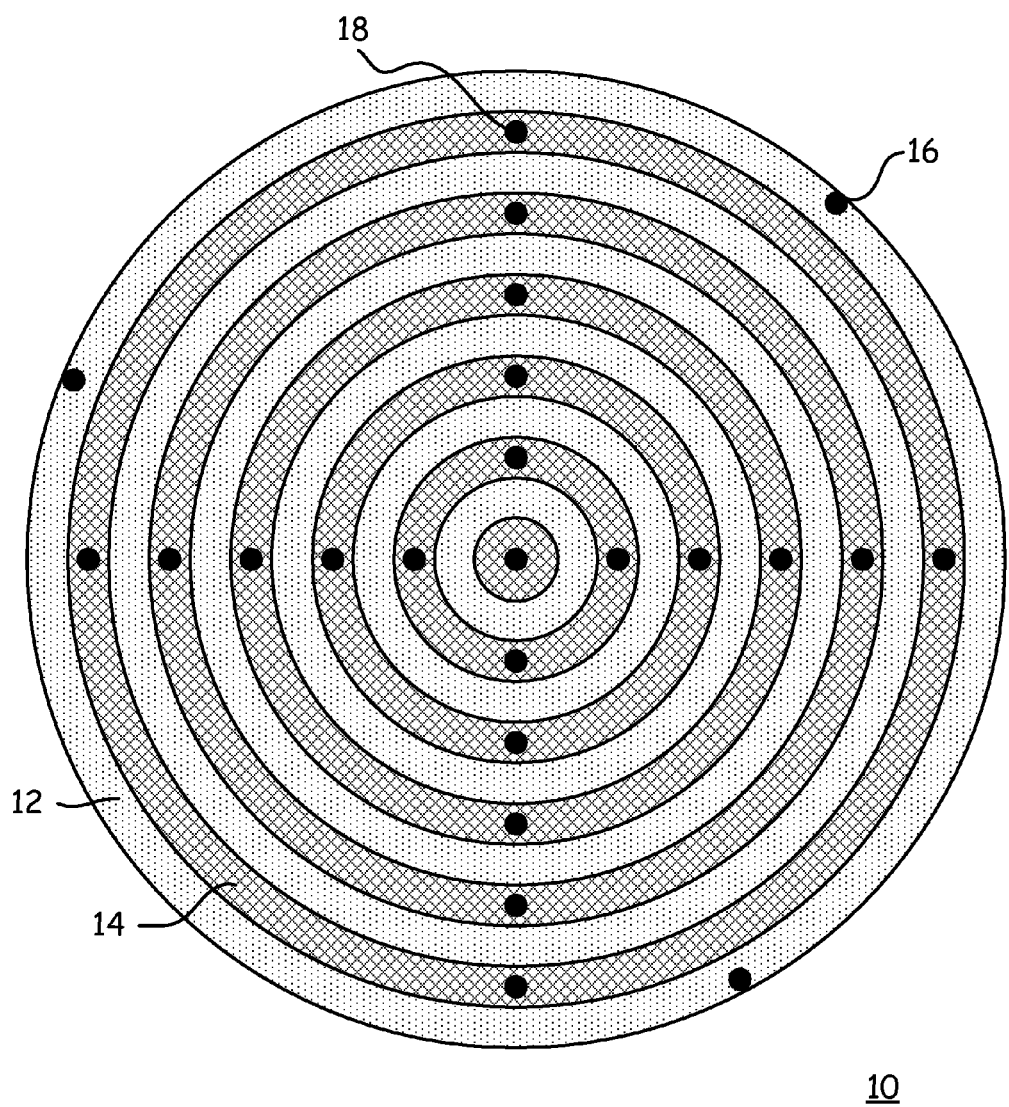
FIG. 1 is a top plan view of a chuck according to an embodiment of the present invention.

With reference now to FIG. 1, there is depicted a top plan view of a chuck 10 according to the present invention. In the embodiment as depicted, the chuck 10 has a generally circular shape, which corresponds to the most common shape of the substrates on which integrated circuits are fabricated. As viewed from the top of the chuck 10, the chuck 10 includes gas pressure delivery portions 12 and gas vacuum drawing portions 14. Also visible are example embodiments of the retaining means 16, which in the embodiment depicted include pins that extend up above the substrate receiving surface of the chuck 10, and gas vacuum drawing channels 18. These elements of the chuck 10 as introduced above are describe with greater detail hereinafter.

In the embodiment of FIG. 1, the gas pressure delivery portions 12 of the chuck 10 are formed in discreet annular rings, with the gas vacuum drawing portions 14 defined between the discreet annular rings. In some embodiments, the retaining means 16 are an annular lip disposed around the outer circumference of the chuck 10, which lip extends up above the substrate receiving surface of the chuck 10.

Figure 2:
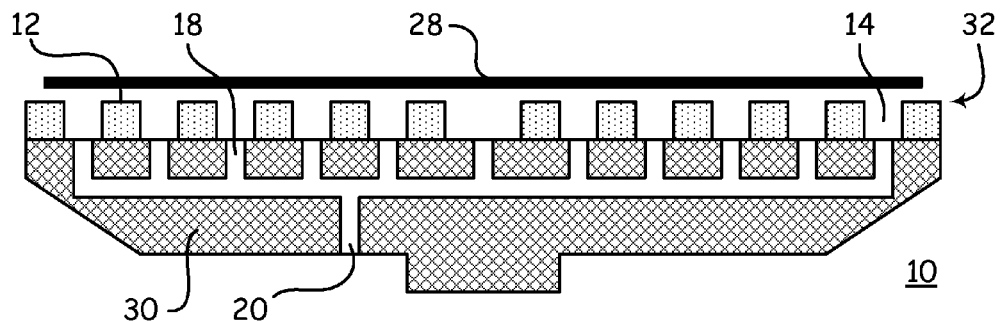
FIG. 2 is a cross sectional view of a chuck according to an embodiment of the present invention, depicting gas vacuum drawing channels.

With reference now to FIG. 2, there is depicted a cross-sectional view of an embodiment of the chuck 10. As depicted in the embodiment of FIG. 2, the gas pressure delivery portions 12 extend up above the body 30 of the chuck 10. The tops of the gas pressure delivery portions 12 define a substrate receiving surface 32, for "receiving" the substrate 28, with the back of the substrate 28 facing the substrate receiving surface 32, and the face of the substrate 28 facing away from the chuck 10. It is appreciated that the substrate receiving surface 32 does not actually "receive" the substrate 28, in that the substrate 28, during the operation of the chuck 10, does not physically contact the chuck 10. Thus, during the operation of the chuck 10, the substrate 28 is retained proximate—but not touching—the substrate receiving surface 32.

As depicted in FIG. 2, there are gas vacuum drawing channels 18 formed throughout the body 30 of the chuck 10. The gas vacuum drawing channels 18 of the embodiment depicted are in communication with the gas vacuum drawing portions 14 of the chuck 10, and are also in communication with the gas vacuum drawing port 20. In some embodiments, the gas vacuum drawing port 20 is connected to a vacuum source. The vacuum source draws a vacuum through the gas vacuum drawing port 20, through the gas vacuum drawing channels 18, and through the gas vacuum drawing portions 14. The vacuum that is drawn is sufficient to retain the substrate 28 proximate the substrate receiving surface 32 of the chuck 10.

Figure 3:
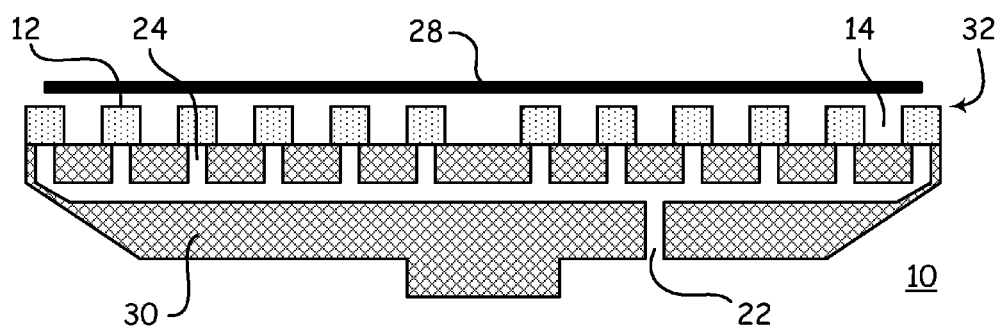
FIG. 3 is a cross sectional view of a chuck according to an embodiment of the present invention, depicting gas pressure delivery channels.

With reference now to FIG. 3, there is depicted a cross-sectional view of an embodiment of the chuck 10. As depicted in FIG. 3, there are gas pressure delivery channels 24 formed throughout the body 30 of the chuck 10. The gas pressure delivery channels 24 of the embodiment depicted are in communication with the gas pressure delivery portions 12 of the chuck 10, and are also in communication with the gas pressure delivery port 22. In some embodiments, the gas pressure delivery port 22 is connected to a pressure source. The pressure source pushes a gas pressure through the gas pressure delivery port 22, through the gas pressure delivery channels 24, and through the gas pressure delivery portions 12. The gas pressure that is delivered is sufficient to push the substrate 28 away from the chuck 10, so that the back of the substrate 28 does not contact the receiving surface 32 of the chuck 10 during operation.

In some embodiments the gas pressure delivery channels 24 and the gas vacuum drawing channels 18 are mutually exclusive within the body 30 of the chuck 10, meaning that they are not in fluid communication with each other in the body 30 of the chuck 10. Thus, the vacuum that is drawn through the gas vacuum drawing portions 14 and the pressure that is delivered through the gas pressure delivery portions 12 are relatively independent one from another, except as described in more detail below.

In the embodiments depicted in FIGS. 2 and 3, the body 30 of the chuck 10 may be formed of any material that has the structural strength and other properties necessary to provide the functions of a wafer chuck as contemplated by those with skill in the art. For example, the body 30 of the chuck 10 may be formed of steel, aluminum, Teflon, ceramic, carbon, or some other suitable material.

The gas pressure delivery portions 12 of the embodiments depicted in FIGS. 2 and 3 are formed of a porous material, such as a porous ceramic or carbon. Thus, the material of the gas pressure delivery portions 12 is disposed over the top of the gas pressure delivery channels 24, and the gas pressure delivered by the gas pressure delivery channels 24 is forced up through and out of the pores of the gas pressure delivery portions 12. At the same time, the gas vacuum is drawn through the gas vacuum drawing portions 14, creating a push-pull effect on the back of the substrate 28. By adjusting the relative strengths/flows of the vacuum and the pressure, the substrate 28 can be retained at a desired vertical position from the substrate receiving surface 32. The retaining means 16, such as the pins depicted in FIG. 1 or a lip, prevent the substrate 28 from sliding off the chuck 10 in an X-Y direction. In this manner, the substrate 28 is reliably held proximate the chuck 10, without the back of the substrate 10 making physical contact with the substrate receiving surface 32 of the chuck 10.

Figure 4:
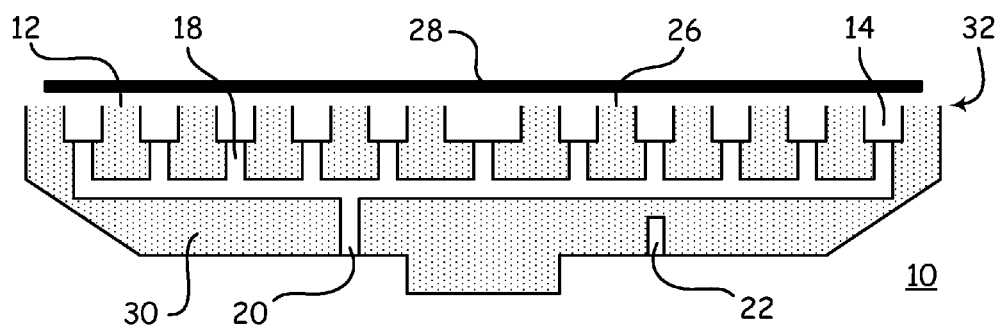
FIG. 4 is a cross sectional view of a chuck according to another embodiment of the present invention.

With reference now to FIG. 4, there is depicted a cross-section diagram of another embodiment of the chuck 10. In the embodiment as depicted, the body 30 of the chuck 10 is substantially completely formed of the porous material. However, the surfaces of the body 30 of the chuck 10 have been sealed so that they are vitreous. In other words, the porosity of the material of the body 30 allows gas to flow within the body 30 of the chuck, but the vitreous nature of the surfaces, including the surfaces of the gas vacuum drawing channels 18, prevent any gas communication across the surfaces that are sealed in this manner.

The body 30 of the chuck 10 is not sealed in two general locations. The first location is the substrate receiving surface 32, which allows the gas pressure to be delivered through the substrate receiving surface 32. The second location is the gas pressure delivery port 22, which allows the gas pressure to be delivered from the gas pressure delivery source and into the body 30 of the chuck 10. Thus, in this embodiment, the chuck 10 can be formed of a single material.

The chuck 10 as depicted in FIG. 4 could be formed by casting a porous material into the general shape of the chuck 10, performing whatever machining might be necessary to substantially complete the fabrication of the chuck 10, and then vitrifying the surfaces of the chuck 10, such as by passing hot or other vitrifying gases through the gas vacuum drawing channels 18 and across the exterior surfaces of the chuck 10. The sealed surface of the substrate receiving surface 32 could then be removed such as by lapping the substrate receiving surface 32 to remove the vitrified layer. The gas pressure delivery port could then be formed by drilling a blind bore into the body 30 of the chuck 10.

It is noted that separately fabricated gas pressure delivery channels 24 are not required in this embodiment, as the porosity of the material of the body 30 of the chuck 10 provides the pressure delivery functions that are provided by the gas pressure delivery channels 24 in other embodiments.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A chuck for releasably retaining a substrate, the chuck comprising:

a body formed of a porous material having a substantially complete vitreous shell on all surfaces except for a substrate receiving surface, the substrate receiving surface disposed in an X-Y coordinate plane and adapted to receive the substrate, the substrate receiving surface having recessed annular channels with vitreous sidewalls disposed between discreet annular rings of the porous material, the recessed annular channels defining gas vacuum drawing portions and the discreet annular rings defining gas pressure delivery portions, the porous material of the body acting as gas pressure delivery channels, the body having gas vacuum drawing channels with vitreous sidewalls to isolate the gas vacuum drawing channels from the gas pressure delivery channels, where the gas pressure delivery channels and gas vacuum drawing channels are mutually exclusive within the body, the gas pressure delivery portions in communication with the gas pressure delivery channels, for delivering a gas pressure against the substrate while the substrate is retained by the chuck, and thereby keeping the substrate from contacting the substrate receiving surface, the gas vacuum drawing portions in communication with the gas vacuum drawing channels, for drawing a gas vacuum against the substrate while the substrate is retained by the chuck, and thereby retaining the substrate proximate the substrate receiving surface, and retaining means for retaining the substrate in X-Y directions from sliding off of the substrate receiving surface.

2. The chuck of claim 1, wherein the body is formed of at least one of ceramic material and carbon material.

3. The chuck of claim 1, wherein the retaining means comprise two fixed pins and one adjustable pin disposed at substantially equidistant positions around a peripheral edge of the substrate receiving surface.

4. The chuck of claim 1, wherein the substrate receiving surface is substantially round.

5. The chuck of claim 1, the body further comprising a gas pressure port for connection to a gas pressure source, the gas pressure port in communication with the gas pressure delivery channels.

6. The chuck of claim 1, the body further comprising a gas vacuum port for connection to a gas vacuum source, the gas vacuum port in communication with the gas vacuum drawing channels.

* * * * *